US 6,602,774 B1

(12) United States Patent
Fontana et al.

(10) Patent No.: US 6,602,774 B1
(45) Date of Patent: Aug. 5, 2003

(54) SELECTIVE SALICIDATION PROCESS FOR ELECTRONIC DEVICES INTEGRATED IN A SEMICONDUCTOR SUBSTRATE

(75) Inventors: Gabriella Fontana, Vimercate (IT); Luca Pividori, Curno (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/473,367

(22) Filed: Dec. 28, 1999

(30) Foreign Application Priority Data

Dec. 29, 1998 (EP) .............................. 98830793

(51) Int. Cl.7 .................. H01L 21/3205; H01L 21/321; H01L 21/28; H01L 21/4763
(52) U.S. Cl. ...................... 438/593; 438/649; 438/656; 438/660; 438/683
(58) Field of Search ................................ 438/633, 648, 438/656, 660, 683, 257, 299, 649, 593

(56) References Cited

U.S. PATENT DOCUMENTS

| 4,935,378 | A | * | 6/1990 | Mori | |
| 5,470,772 | A | | 11/1995 | Woo | 437/43 |
| 5,654,219 | A | * | 8/1997 | Huber | |
| 5,683,941 | A | | 11/1997 | Kao et al. | 437/200 |
| 5,888,870 | A | * | 3/1999 | Gardener | 438/261 |
| 5,962,890 | A | * | 10/1999 | Sato | 257/320 |
| 6,133,096 | A | * | 10/2000 | Su | 438/264 |
| 6,136,649 | A | * | 10/2000 | Hui | 438/257 |
| 6,143,613 | A | * | 11/2000 | Lin | 438/299 |
| 6,177,311 | B1 | * | 1/2001 | Kauffman | 438/257 |
| 6,194,258 | B1 | * | 2/2001 | Wuu | 438/200 |

FOREIGN PATENT DOCUMENTS

EP 0 200 364 A 11/1986

* cited by examiner

Primary Examiner—Mary Wilczewski
(74) Attorney, Agent, or Firm—Lisa K. Jorgenson; Robert Iannucci; Seed IP Law Group PLLC

(57) ABSTRACT

A selective silicidation process for electronic devices that are integrated on a semiconductor substrate is presented. The devices have a number of active elements formed with gate region that has at least one polysilicon layer. The process begins with depositing a dielectric layer over the entire surface of the semiconductor. Then portions of the dielectric layer are removed to expose the polysilicon layer in the gate regions. Next, a layer of a transition metal is deposited and subjected to a thermal treatment for selectively reacting it with the polysilicon layers and producing a silicide layer over the gate regions.

17 Claims, 3 Drawing Sheets

SELECTIVE SALICIDATION PROCESS FOR ELECTRONIC DEVICES INTEGRATED IN A SEMICONDUCTOR SUBSTRATE

TECHNICAL FIELD

This invention relates to a selective silicidation process for electronic devices integrated on a semiconductor substrate, and more particularly for electronic devices including a plurality of active elements formed with gate regions having at least one polysilicon layer, and for non-volatile electronic memory devices having multiple active elements formed with gate and drive regions having at least one polysilicon layer.

BACKGROUND OF THE INVENTION

The invention relates in particular, but not exclusively, to a selective silicidation process for the active elements of an EPROM or Flash EPROM cell, and the description to follow will consider this field of application for convenience of explanation.

Non-volatile memory devices integrated on a semiconductor substrate comprise matrices of memory cells where each cell includes a floating gate MOS transistor; and control circuitry including fast-logic MOS transistors.

Each floating gate MOS transistor conventionally comprises a drain region and a source region which are formed in the semiconductor substrate and separated by a channel region. A floating gate electrode is formed over the substrate and isolated therefrom by a thin layer of gate oxide. A control electrode is capacitively coupled to the floating gate electrode through a dielectric layer.

Each matrix of memory cells is organized into rows, known as the word lines, and columns, known as the bit lines. Cells belonging to the same word line have a common supply line which drives their respective control electrodes, and cells belonging to the same bit line have their drain terminals in common.

When memory devices of very small size are formed, the interconnect lines between the gate electrodes, which may be on the order of 0.25 um, for example, include layers of a low resistivity material.

Prior solutions for providing the low resistivity material layers have used composite material layers, known as silicides, which include silicon and a transition metal such as titanium, to cover those areas where resistivity is to be lowered.

Formation of a silicide layer over the active areas of MOS transistors comprises the following steps, following the formation of the transistor gate: implanting source and drain regions of the transistor; depositing a transition metal; and subjecting the transition metal to a thermal process for selectively reacting it with the substrate surface and producing the silicide layer.

This prior art method has problems when applying the thermal process for reacting the transition metal layer with the substrate surface in order to produce the silicidation of the implanted source and drain regions. Because a surface layer of the substrate is consumed, some of the dopant in the substrate leaks into the silicide layer. Accordingly, the silicide layer may become short-circuited to the substrate, thereby interfering with the normal operation of the cell.

SUMMARY OF THE INVENTION

Embodiments of the invention provide a silicidation process for the gate electrodes of electronic devices, specifically memory devices, having such features that the formation of a silicide layer over the implanted regions in the semiconductor substrate can be prevented, thereby overcoming the drawbacks with which prior art silicidation processes have been beset.

Therefore embodiments of the invention provide an improved process flow for silicidizing electronic devices which includes, before the silicidation step, a step of forming a dielectric layer to cover all the areas where the silicidation process may be critical and only leaving uncovered only those polysilicon portions where silicidation is instead desirable, without introducing any additional masking steps in the process.

Presented is a selective silicidation process for electronic devices integrated on a semiconductor substrate that include more than one of active elements formed with gate regions having at least one polysilicon layer. The process begins with depositing a dielectric layer over the entire surface of the semiconductor. Next the dielectric layer is removed to expose the polysilicon layer of the gate regions. A layer of a transition metal is deposited and subjected to a thermal treatment for selectively reacting it with the polysilicon layers and producing a silicide layer over the gate regions.

The features and advantages of a process according to the invention will be apparent from the following description of an embodiment thereof, given by way of non-limitative example with reference to the accompanying drawings.

DETAILED DESCRIPTION

Figure 1:
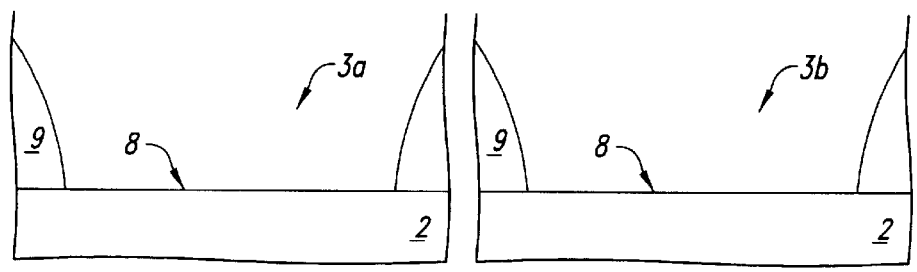
FIGS. 1 to 10 are vertical cross-sectional views of a portion of a semiconductor substrate showing steps of a silicidation process according to an embodiment of the invention.

Referring to the drawings, an improved selective silicidation process for electronic devices that are integrated on a semiconductor substrate 2, specifically memory devices of the EPROM and Flash EPROM types, will be described herein below. Shown to an enlarged scale in the Figures are vertical cross-sections through portions, not necessarily adjacent one another, of a semiconductor substrate wherein the memory devices are formed in accordance with an embodiment of the invention.

Some process steps will not be discussed in detail in the description which follows, not to burden it with information of minor weight already available to the skilled persons in the art. Discussion of steps well known to those skilled in the art has been abbreviated or eliminated for brevity.

The first step in the process of fabricating EPROM or Flash EPROM memory devices conventionally comprises forming active areas 8 of all the active elements, such as floating gate MOS transistors 3b, of the matrix, and transistors 3a of the circuitry (not shown). The definition of the active areas 8, isolated from one another by insulating regions consisting of a field oxide 9, is carried out conventionally. The substrate 2 in this stage of the process is shown in FIG. 1.

Figure 2:
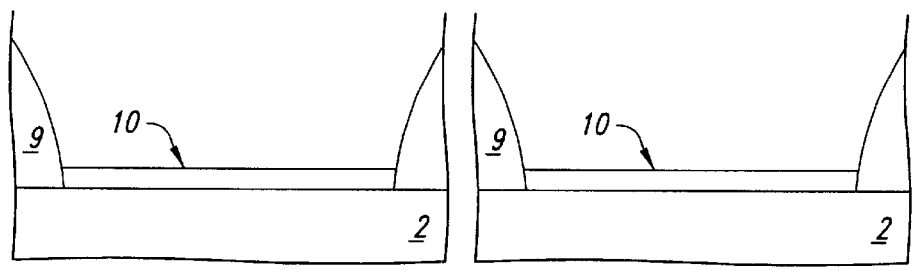
Figure 3:
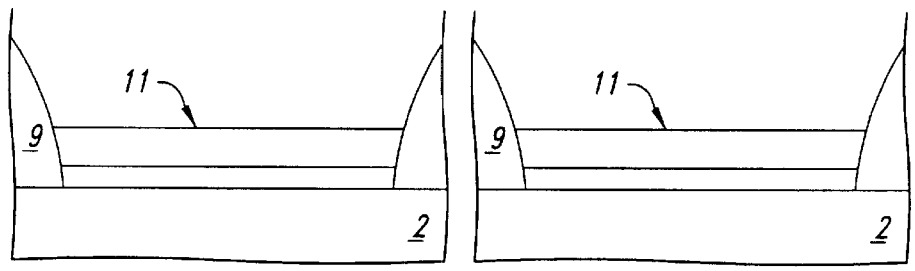

After defining the active areas 8, a gate oxide layer 10 may be grown or deposited for forming the transistors 3a, 3b (FIG. 2). A first conducting layer, e.g., a first polysilicon layer 11, is then deposited (FIG. 3).

A first resist mask for patterning the first polysilicon layer 11, referred to in the art as the POLY1 mask, is used to define a portion of floating gate electrodes 4a of the memory cells.

Figure 4:
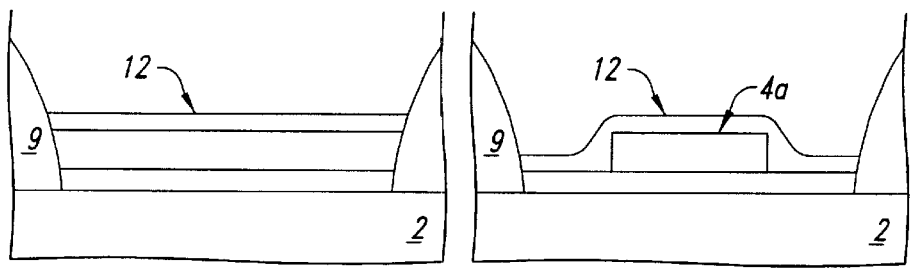

By way of a conventional photolithographic step, the areas of the polysilicon layer 11 that are not protected by the POLY1 mask are etched away. Upon removal of the POLY1 mask, an intermediate dielectric layer 12, e.g., of ONO (oxide-Nitride-oxide), is deposited (FIG. 4).

A second resist mask, referred to in the art as the MATRIX mask, is then used for masking the portion of the semiconductor 2 where the memory matrix is to be formed. By a conventional photolithographic step, the first polysilicon layer 11 and the intermediate dielectric layer 12, being unprotected by the MATRIX mask, are etched away to expose the gate oxide layer 10 in the portion of the semiconductor 2 where the circuitry is being formed.

Figure 5:
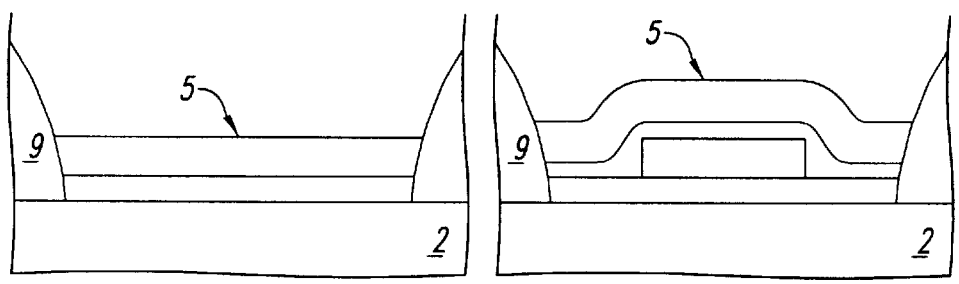
Figure 6:
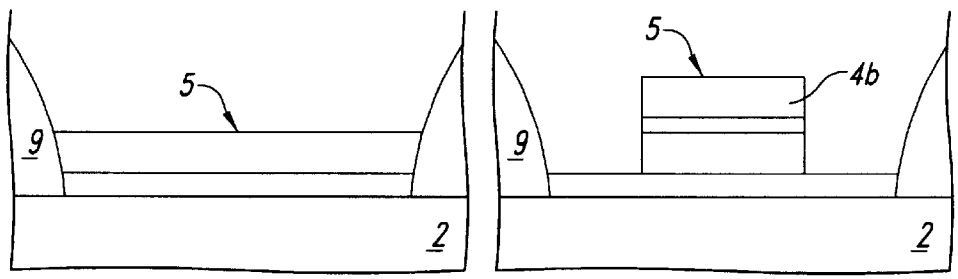

A second conductive layer, e.g., a second polysilicon layer 5, is then deposited over the entire substrate 2 (FIG. 5). At this step of the fabrication process, the control electrodes 4b and word lines WL of the cell matrix which will drive the control electrodes of the memory cells in the same column are defined.

A third resist mask, referred to in the art as the self-aligned etch mask and used for defining the second polysilicon layer 5, is then used for defining the word lines WL of the cell matrix. The second polysilicon layer 5, unmasked by the self-aligned etch mask, is etched away by a conventional photolithographic step.

Advantageously, before removing the self-aligned etch mask, a fourth mask, referred to in the art as the SAS mask, is provided.

Figure 7:
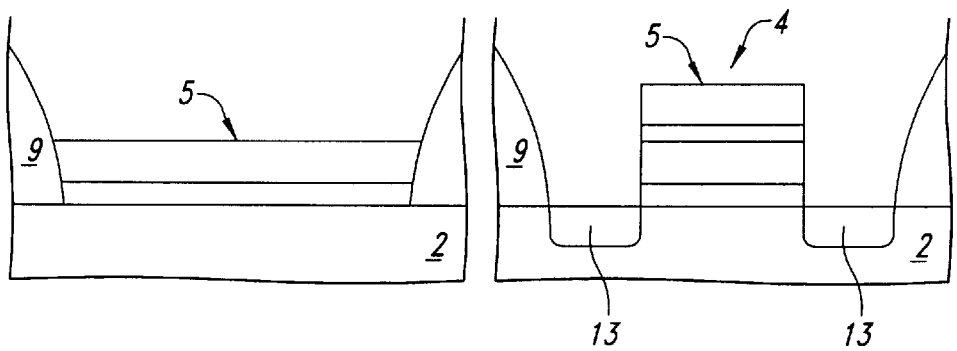
Figure 8:
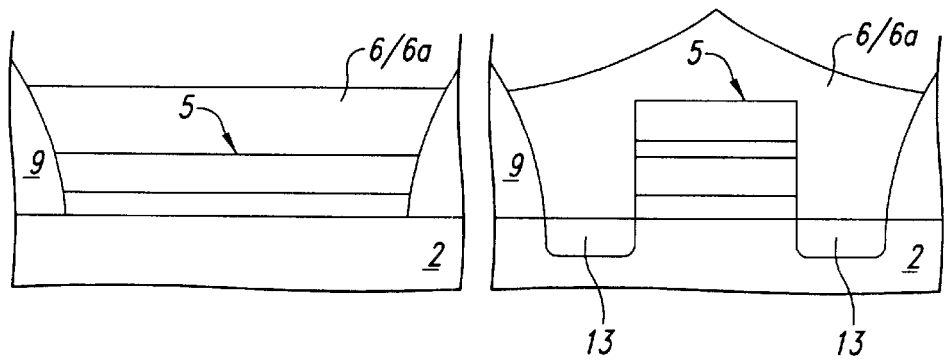
Figure 9:
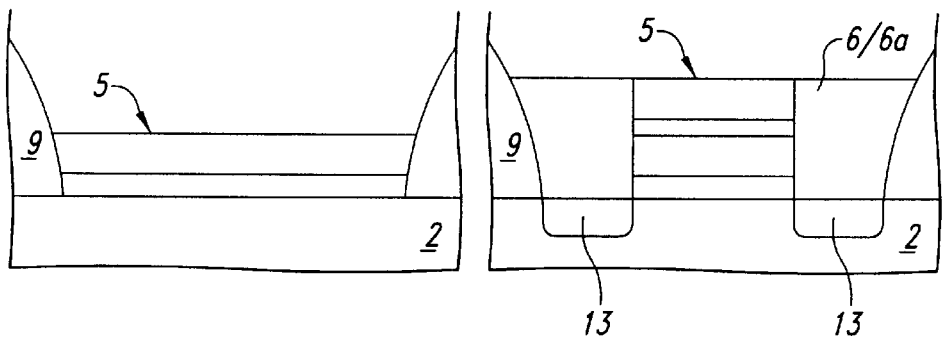
Figure 10:
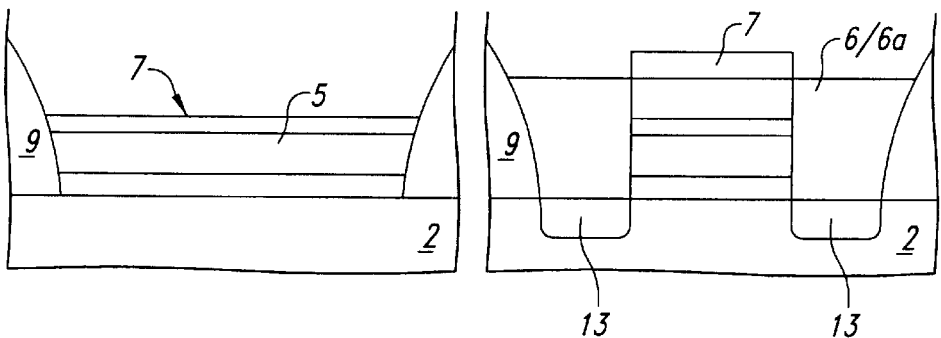

By a conventional photolithographic step, the residual gate oxide layer 10 between the word lines WL is etched away as shown in FIG. 7. This is followed by an ion implantation step to form source and drain regions 13.

The process is continued with the deposition of a first dielectric layer 6 over the entire surface of the substrate. For example, this dielectric layer 6 could be of the TEOS type. The thickness of the dielectric layer is illustratively within the range of 500 A to 3000 A, enough to isolate the transistor gate electrodes 4 and the word lines of the matrix.

A second dielectric layer 6a may be deposited next to fill the gaps between the word lines of the matrix. Nothing prevents the use of a single dielectric filler layer 6 to fill the gaps between the word lines of the matrix. This second dielectric layer 6a may be a doped insulating oxide film of the BPSG type. Alternatively, this second dielectric layer may be deposited by a HDPCVD (High Density Plasma Chemical Vapor Deposition) technique, or a SACVD (Sub-Atmospheric Chemical Vapor Deposition) technique.

At this point, the process provides for a removal of the dielectric layer 6 or the second dielectric layer 6a by a CMP (Chemical Mechanical Polishing) treatment to produce mechanically a planar surface. This removal of second dielectric layer could also be achieved by a dry etch-back step.

The etch-back is carried out to advantage using no additional masks, and is continued until the surface of the second polysilicon layer 5 of the word lines and the surface of the second polysilicon layer 5 in the circuitry become exposed. In this way, the dielectric layer 6 or second dielectric layer 6a is confined to just the gap regions between the word lines, and only the areas to be silicized are exposed.

At this point, a transition metal, such as titanium, is deposited and then processed thermally to cause it to react selectively with the uncovered areas by the dielectric layer and produce a silicide layer 7.

In summary, the process of this invention allows the resistance of the conductive polysilicon layers to be reduced, and silicidation of the source and drain regions of the memory matrix avoided, thereby preventing any dangerous bridging by the silicide between the source/drain regions and the first polysilicon layer or the substrate surface in the active areas, which would impair the proper operation of the matrix, without introducing any additional masking steps in the process flow.

Changes can be made to the invention in light of the above detailed description. In general, in the following claims, the terms used should not be construed to limit the invention to the specific embodiments disclosed in the specification and the claims, but should be construed to include all methods and devices that are in accordance with the claims. Accordingly, the invention is not limited by the disclosure, but instead its scope is to be determined by the following claims.

What is claimed:

1. A method for silicidizing non-volatile electronic memory devices integrated on a semiconductor substrate, the process comprising:

forming a plurality of field oxide regions on the substrate to define opposite sides of an active region of the substrate;

forming a first polysilicon layer on the semiconductor substrate;

forming an interpoly dielectric layer on the first polysilicon layer;

masking portions of the first polysilicon layer and the interpoly dielectric layer with a matrix mask, while leaving other portions uncovered;

etching the uncovered portions of the first polysilicon layer and the interpoly dielectric layer in circuitry areas of the semiconductor substrate;

forming a second polysilicon layer on the interpoly dielectric layer;

masking portions of the second polysilicon layer in the circuitry areas of the semiconductor substrate with a self aligned etch mask while leaving other portions of the second polysilicon layer in the circuitry areas uncovered;

etching the uncovered portions of the second polysilicon layer in the circuitry areas of the semiconductor substrate to form interconnection lines;

masking further portions of the second polysilicon layer above remaining portions of the first polysilicon layer and the interpoly dielectric layer;

etching the further portions of the second polysilicon layer to form a stacked gate structure;

depositing a dielectric layer over a surface of the semiconductor substrate, the dielectric layer extending completely between the stacked gate structure and the field oxide regions;

removing a first portion of the dielectric layer to expose first uncovered portions of the second polysilicon layer at the stacked gate structure without exposing any portions of the substrate between the stacked gate structure and the field oxide regions;

depositing a layer of a transition metal on the first uncovered portions of the second polysilicon layer; and selectively reacting the layer of the transition metal with the first uncovered portions of the second polysilicon layer to produce a silicide layer over the stacked gate structure and the interconnection lines without reacting the transition metal with the substrate between the stacked gate structure and the field oxide regions.

2. The method of claim 1 wherein depositing a dielectric layer over the surface of the semiconductor substrate comprises:
   depositing a first dielectric layer over the surface of the semiconductor substrate; and
   depositing a second dielectric layer over the first dielectric layer.

3. The method of claim 2 wherein depositing a first dielectric layer over the surface of the semiconductor substrate comprises depositing a TEOS layer.

4. The method of claim 2 wherein depositing a second dielectric layer over the first dielectric layer comprises depositing a layer of BPSG over the first dielectric layer.

5. The method of claim 4 wherein depositing the second dielectric comprises High Density Plasma Chemical Vapor Deposition.

6. The method of claim 4 wherein depositing the second dielectric comprises Sub Atmospheric Chemical Vapor Deposition.

7. A method for silicidizing non-volatile electronic memory devices integrated on a semiconductor substrate, the process comprising:
   forming a first polysilicon layer on the semiconductor substrate;
   forming an interpoly dielectric layer on the first polysilicon layer;
   masking portions of the first polysilicon layer and the interpoly dielectric layer with a matrix mask, while leaving other portions uncovered;
   etching the uncovered portions of the first polysilicon layer and the interpoly dielectric layer in circuitry areas of the semiconductor substrate;
   forming a second polysilicon layer on the interpoly dielectric layer;
   masking portions of the second polysilicon layer in the circuitry areas of the semiconductor substrate with a self aligned etch mask while leaving other portions of the second polysilicon layer in the circuitry areas uncovered;
   etching the uncovered portions of the second polysilicon layer in the circuitry areas of the semiconductor substrate to form interconnection lines;
   masking further portions of the second polysilicon layer above remaining portions of the first polysilicon layer and the interpoly dielectric layer;
   etching the further portions of the second polysilicon layer to form a stacked gate structure;
   depositing a dielectric layer over a surface of the semiconductor substrate;
   removing a first portion of the dielectric layer to expose first uncovered portions of the second polysilicon layer;
   depositing a layer of a transition metal on the first uncovered portions of the second polysilicon layer; and
   selectively reacting the layer of the transition metal with the first uncovered portions of the second polysilicon layer to produce a silicide layer over the stacked gate structure and the interconnection lines, wherein removing a first portion of the dielectric layer comprises planarizing the dielectric layer.

8. A method for silicidizing non-volatile electronic memory devices integrated on a semiconductor substrate, the process comprising:
   forming a first polysilicon layer on the semiconductor substrate;
   forming an interpoly dielectric layer on the first polysilicon layer;
   masking portions of the first polysilicon layer and the interpoly dielectric layer with a matrix mask, while leaving other portions uncovered;
   etching the uncovered portions of the first polysilicon layer and the interpoly dielectric layer in circuitry areas of the semiconductor substrate;
   forming a second polysilicon layer on the interpoly dielectric layer;
   masking portions of the second polysilicon layer in the circuitry areas of the semiconductor substrate with a self aligned etch mask while leaving other portions of the second polysilicon layer in the circuitry areas uncovered;
   etching the uncovered portions of the second polysilicon layer in the circuitry areas of the semiconductor substrate to form interconnection lines;
   masking further portions of the second polysilicon layer above remaining portions of the first polysilicon layer and the interpoly dielectric layer;
   etching the further portions of the second polysilicon layer to form a stacked gate structure;
   depositing a dielectric layer over a surface of the semiconductor substrate by depositing a first dielectric layer over the surface of the semiconductor substrate and depositing a second dielectric layer over the first dielectric layer;
   removing a first portion of the dielectric layer to expose first uncovered portions of the second polysilicon layer;
   depositing a layer of a transition metal on the first uncovered portions of the second polysilicon layer; and
   selectively reacting the layer of the transition metal with the first uncovered portions of the second polysilicon layer to produce a silicide layer over the stacked gate structure and the interconnection lines, wherein removing a first portion of the dielectric layer comprises planarizing the second dielectric layer.

9. The method of claim 8 wherein planarizing the second dielectric layer comprises Chemical Mechanical Polishing.

10. The method of claim 8 wherein planarizing the second dielectric layer comprises dry etching back the second dielectric layer.

11. A selective silicidation process for electronic devices integrated on a semiconductor substrate, the process comprising:
   forming a plurality of field oxide regions on the substrate to define opposite sides of an active region of the substrate;
   forming a first polysilicon layer on said semiconductor substrate;
   forming an interpoly dielectric layer on said first polysilicon layer;
   forming a second polysilicon layer on said interpoly dielectric layer;
   etching said second polysilicon, interpoly dielectric, and first polysilicon layers to form a stacked gate structure;
   depositing a dielectric layer over a surface of said semiconductor substrate, the dielectric layer extending completely between the stacked gate structure and the field oxide regions;
   removing a portion of said dielectric layer to expose said second polysilicon layer of said stacked gate structure without exposing any of the substrate between the stacked gate structure and the field oxide regions;

depositing a layer of a transition metal over said exposed second polysilicon layer; and treating said transition metal thermally to selectively react it with said exposed second polysilicon layers in order to produce a silicide layer over said stacked gate structure without reacting the transition metal with the substrate between the stacked gate structure and the field oxide regions.

12. The selective silicidation process according to claim 11, wherein depositing a dielectric layer over a surface of said semiconductor substrate comprises depositing a layer of TEOS over an entire surface of said semiconductor substrate.

13. The selective silicidation process according to claim 11, wherein depositing a layer of a transition metal comprises depositing a layer of titanium.

14. The selective silicidation process of claim 11, wherein removing a portion of said dielectric layer comprises planarizing said dielectric layer.

15. A selective silicidation process for electronic devices integrated on a semiconductor substrate, the process comprising:

forming a first polysilicon layer on said semiconductor substrate;

forming an interpoly dielectric layer on said first polysilicon layer;

etching said interpoly dielectric layer and said first polysilicon layer to form a floating gate;

forming a second polysilicon layer on said interpoly dielectric layer after said interpoly dielectric layer and said first polysilicon layer have been etched to form a floating gate;

etching said second polysilicon layer to form a control gate and a stacked gate structure;

depositing a dielectric layer over a surface of said semiconductor substrate;

removing a portion of said dielectric layer to expose said second polysilicon layer of said stacked gate structure;

depositing a layer of a transition metal over said exposed second polysilicon layer; and treating said transition metal thermally to selectively react it with said exposed second polysilicon layers in order to produce a silicide layer over said stacked gate structure, wherein removing a portion of said dielectric layer comprises planarizing said dielectric layer.

16. The selective silicidation process according to claim 15, wherein planarizing said dielectric layer comprises Chemical Mechanical Polishing said dielectric layer.

17. The selective silicidation process according to claim 15, wherein planarizing said dielectric layer comprises a dry etch-back process of said dielectric layer.

* * * * *